(12) United States Patent
Martin

(10) Patent No.: US 6,407,627 B1
(45) Date of Patent: Jun. 18, 2002

(54) TUNABLE SALLEN-KEY FILTER CIRCUIT ASSEMBLY AND METHOD

(75) Inventor: Brian C. Martin, Carlsbad, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/778,288

(22) Filed: Feb. 7, 2001

(51) Int. Cl.$^7$ .................................................. H03B 1/00
(52) U.S. Cl. ........................................ 327/552; 327/551
(58) Field of Search ................................. 327/552, 551, 327/553, 561, 555, 554, 558; 330/107, 109; 333/172, 175

(56) References Cited

U.S. PATENT DOCUMENTS

| | | | |
|---|---|---|---|
| 3,571,740 A | 3/1971 | Goncharoff | 330/28 |
| 3,778,710 A | 12/1973 | Snook | 324/123 R |
| 3,805,178 A * | 4/1974 | Rollett | 330/107 |
| 4,739,189 A * | 4/1988 | Kellogg | 327/555 |
| 5,077,783 A | 12/1991 | Leppänen | 379/27 |
| 5,241,961 A | 9/1993 | Henry | 607/32 |
| 5,423,070 A | 6/1995 | Vaisanen et al. | 455/67.1 |
| 5,929,699 A * | 7/1999 | Lewicki | 327/552 |
| 5,963,112 A * | 10/1999 | Moschytz | 327/552 |
| 6,032,166 A | 2/2000 | Signell et al. | 708/3 |
| 6,069,505 A * | 5/2000 | Babanezhad | 327/552 |
| 6,097,244 A * | 8/2000 | Chen | 327/553 |

FOREIGN PATENT DOCUMENTS

JP 58145259 A 8/1983
JP 59165509 9/1984

OTHER PUBLICATIONS

P.F. Santos, J.E. Franca, and R. Schaumann "Design and Tuning Techniques for a 100 MHz CMOS Continous–Time Narrow–Bandwidth Bandpass Filter", IEEE 1996.

* cited by examiner

*Primary Examiner*—Tuan T. Lam
*Assistant Examiner*—Linh Nguyen

(57) ABSTRACT

A Sallen-Key filter circuit having an operational amplifier of unity gain is tuned by replacing a resistor of the circuit with an adjustable resistor ladder network. The ladder network has an input and first and second output terminals and a plurality of arms connected in series between the input and first output terminal. Each arm has a resistor R and a node separating each pair of adjacent arms, a shunt arm connected to each node, each shunt arm having a resistor which has a value which is a multiple of R and a switch in series. Each switch controls connection of the respective shunt arm to the first or second output terminal, such that the resistance of the ladder network is varied dependent on the switch positions. The first output terminal is connected to the amplifier output and the second output terminal is connected to the amplifier positive input.

10 Claims, 2 Drawing Sheets

TUNABLE SALLEN-KEY FILTER CIRCUIT
ASSEMBLY AND METHOD

BACKGROUND OF THE INVENTION

The present invention relates generally to Sallen-Key filter circuits, and is particularly concerned with tuning of such circuits.

Component variation from chip to chip is a widely recognized problem in integrated circuits (IC) design. One widely recognized technique for dealing with this problem is the tuning of components under digital control until the error due to component variations becomes negligible. In a typical RC filter composed of amplifiers, resistors and capacitors, the accuracy of filter transfer function is determined by the resistor and capacitor values. In general, either resistors or capacitors can be tuned to obtain the required overall transfer function. Tuning can be performed efficiently by switching small-valued components in or out of the circuit. As the dominant non-ideality of a reasonably-sized microswitch is its parasitic resistance (up to very high frequencies), tuning of capacitors poses a difficulty as a result of an undesired resistance appearing in series with the capacitor to be tuned. Tuning of resistors, therefore, can be more effective in many realizations. A resistor is commonly tuned by switching in or out some small-valued resistors that are in series with the resistor to be tuned. Switches are closed and opened to include more or less resistance in series with the resistance to be tuned. When fine tuning is desired, the switched resistors need to be much smaller than the resistor to be tuned, typically on the order of one hundredth or less. This necessarily requires large size switches, such that the parasitic switch resistance can be neglected next to the tuning resistors. A typical example is a 5k resistor to be tuned to below 1% precision. This requires less than 50 ohm tuning resistors, which in turn requires a switch resistance on the order of 10 ohms or less. A switch with such a low on resistance requires a transistor that is several hundred times larger than a minimum geometry device. Note that, increased switch size, besides requiring more chip real estate, also exhibits higher parasitic capacitance along the signal path, and increased noise coupling through the substrate. The large spread of resistor values also limits the accuracy and matching between resistors. Small-valued resistors also require much more hand-tailoring in layout, as their aspect ratios turn out to be awkward, and parasitic contact resistances introduce considerable error to overall resistance. Another difficulty is that different tuning resistor values are needed for each different resistor value to be tuned (such that the same relative accuracy can be maintained across all resistors). For example, 50 ohm resistors are needed to tune a 5k resistance, whereas 75 ohm resistors would be needed to tune 7.5k resistor with the same relative increments.

A Sallen-Key filter has an operational amplifier of unity gain connected in a circuit with two resistors and two capacitors. It is normal to tune both resistors and both capacitors in such filter circuits in order to tune the overall filter response. However, such arrangements are complex and ineffecient.

SUMMARY OF THE INVENTION

It is an object of the present invention to provide a new and improved filter circuit with a built-in tuning assembly.

According to one aspect of the present invention, a filter circuit is provided which comprises an operational amplifier connected in unity gain, the amplifier having a positive input, a negative input, and an output, and at least one adjustable resistor connected in series with the amplifier input, the adjustable resistor comprising a resistor ladder network, suitably an R-2R ladder, the R-2R ladder having an input and first and second output terminals, a plurality of arms connected in series with the input and first output terminal, each arm having a resistor R and a node separating each pair of adjacent arms, a shunt arm connected to each node, each shunt arm having a 2R resistor and a switch in series, each switch having a first, closed position connecting the shunt arm to the first output terminal and a second, open position connecting the shunt arm to the second output terminal, such that the resistance of the ladder network is varied dependent on the switch positions and is at a maximum value when all switches are closed and a minimum value when all switches are open, whereby a resistance can be tuned by varying the switch positions in the ladder circuit, the first output terminal being connected to the amplifier output and the second output terminal being connected to the amplifier positive input.

The filter circuit is of the Sallen-Key type and, in an exemplary embodiment, two resistors are connected in series between the circuit input and the amplifier, with the second resistor comprising the adjustable R-2R ladder network, and a first capacitor is connected between the junction connecting the two resistors and the amplifier output. A second capacitor is connected between the second output terminal of the R-2R ladder and ground.

Although either resistor may be used for tuning the Sallen-Key filter circuit, the second resistor is more suitable as one of the terminals is at virtual ground. Due to the unity gain configuration of the amplifier in this circuit in which the output is connected to the negative input of the amplifier, the two output terminals of the R-2R network can be maintained at the same potential simply by connecting one to the amplifier input and the other to the amplifier output. This allows a Sallen-Key filter circuit to be tuned effectively by means of a single tunable resistor network.

BRIEF DESCRIPTION OF THE DRAWINGS

The present invention will be better understood from the following detailed description of an exemplary embodiment of the invention, taken in conjunction with the accompanying drawings in which like reference numerals refer to like parts and in which.

DETAILED DESCRIPTION OF THE DRAWINGS

Figure 1A:
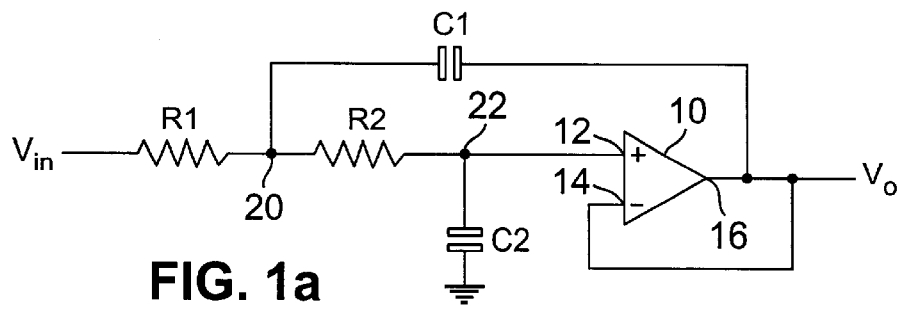
FIG. 1a is a schematic circuit diagram of a conventional Sallen-Key filter circuit.

FIG. 1a illustrates a typical prior art Sallen-Key filter circuit. The circuit comprises an operational amplifier 10 connected in unity gain having positive and negative input terminals 12,14 and an output terminal 16 with the output at terminal 16 connected to the negative input 14. First and second resistors R1 and R2 are connected in series between the input Vin and the positive input terminal 12 of the amplifier 10. A first capacitor C1 is connected between a junction 20 between the two resistors and the output terminal 16 of the amplifier. A second capacitor C2 is connected between one terminal 22 of the second resistor R2 and ground. This conventional filter circuit has, up to now, only been tunable by tuning each of the resistors and capacitors, which is cumbersome and inefficient.

Figure 1B:
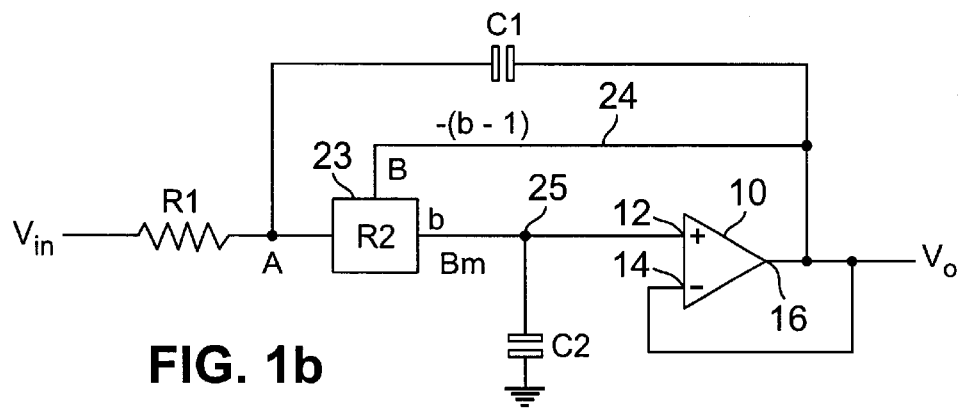
FIG. 1b is a schematic circuit diagram of a Sallen-Key filter circuit with a tunable resistor according to an exemplary embodiment of the present invention.
Figure 2:
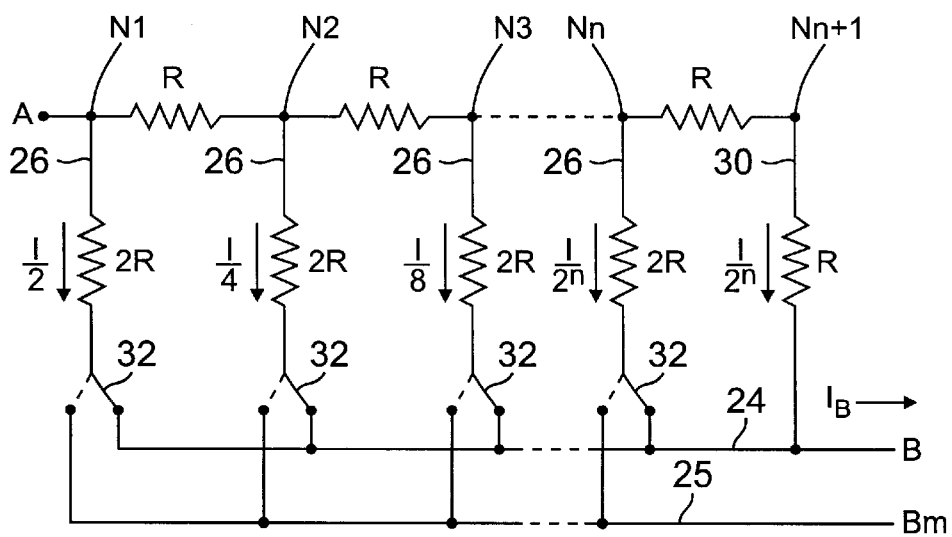
FIG. 2 is a schematic diagram illustrating the R-2R ladder circuit of FIG. 1b in more detail.

FIG. 1b and 2 illustrate an improved, more readily tunable Sallen-Key filter circuit according to an exemplary embodiment of the present invention. Some components in FIG. 1b are identical to those of FIG. 1a, and like reference numerals have been used for like parts as appropriate. In this circuit, the second resistor R2 of FIG. 1a is replaced by an adjustable resistor 23. The adjustable resistor 23 comprises an R-2R ladder network, as illustrated in more detail in FIG. 2, having an input A at the junction between the resistor R1 and the adjustable resistor. As in FIG. 1a, a capacitor C1 is connected between junction A and the output terminal 16 of the operational amplifier 10. One output terminal B of the ladder network is connected via line 24 to the output 16 of the operational amplifier 10, while the second output terminal Bm is connected via output line 25 to the positive input terminal 12 of amplifier 10. Since both the input and output of the amplifier are at the same voltage, due to the fact it is connected in unity gain, this ensures that both outputs B and Bm are at the same potential. A second capacitor C2 is connected between one output terminal Bm of the ladder network and ground.

As best illustrated in FIG. 2, the R-2R ladder has a series of resistors R of constant resistance connected in series between input node A and output node B, with nodes or junctions N1, N2 ... Nn, N(n+1) at the ends of each of the resistors R, with N(n+1) being the final node in the series, and n being the total number of resistors R. A series of branch or shunt lines 26 are connected between each node N1 to Nn and either output line 24 which connects to terminal B or output line 25 which connects to terminal $B_m$, dependent on the position of a switch 32 positioned in each line 26. A resistor 2R having a resistance twice that of resistor R is connected in each shunt line 26. A line 30 connects the final node N(n+1) to the output B, and a resistor R is connected in line 30. The currents in each line 26 and 30 are indicated, with the current in the first line 26 being I/2, the current in the second line being I/4, and the current in the final line 26 and the line 30 being $I/2^n$. In this ladder, the output current at node B, $I_B$, is given by:

$$I_B = \frac{V_A}{R} \cdot b \qquad (1)$$

where b is a parameter representing the switch positions, given by $$b = \sum_{i=1}^{n} Ci2^{-i} \qquad (2)$$

Where n is the total number of branch lines or switches, $V_A$ is the voltage at node A, and C is a constant.

The ladder exhibits constant resistance R with respect to the input terminal A, but the currents coming out of terminals B and Bm depend on the position of the switches. When all switches are closed, as illustrated in solid line in FIG. 3, total current of the ladder is observed at the B terminal. As the switches are opened, into the dotted line position, currents (in vertical branches 12 of the ladder) are stolen from the B terminal and delivered to the Bm terminal. Note that, for proper operation, the B and Bm points of the ladder must be at the same potential, a requirement that is satisfied in this configuration due to the connection of these terminals to an output and input, respectively, of the amplifier 10. Tuning of the overall resistance of the network shown in FIG. 2 can therefore be realized by controlling the switches of the R-2R ladder. The equivalent resistance of the ladder between the A and B terminals is a function of a parameter b representing the switch positions: when all switches are closed, b=1. On the other hand, when all switches are open, $b=2^n$ (because now, only the right most branch's current is available to terminal B). n represents the binary depth of the ladder, which is equal to the number of vertical branches, and also to the number of switches in the ladder. The minimum and maximum resistances that can be obtained from the ladder are equal to R and $2^n R$ respectively.

The transfer function of the Sallen-Key filter circuit of FIG. 1b is derived as follows:

$$\frac{V_2 - V_0}{R_2} b = sC_2 V_0 \frac{bV_2}{R_2} = \left(sC_2 + \frac{b}{R_2}\right) V_0 \qquad (1)$$

$$\left(\frac{1}{R_2} + \frac{1}{R_1} + sC_1\right) V_2 = \left(\frac{1}{R_2} + sC_1\right) V_0 + \frac{1}{R_1} Vin \qquad (2)$$

Combining equations (1) and (2), we get:

$$\left(\frac{1}{R_1} + \frac{1}{R_2} + sC_1\right)\left(sC_2 + \frac{b}{R_2}\right)\frac{R_2}{b} = \left(\frac{1}{R_2} + sC_1\right) V_0 + \frac{1}{R_1} Vin$$

$$(R_1 + R_2 + sC_1 R_1 R_2)\left(s\frac{R_2}{b} C_2 + 1\right) = (R_1 + sC_1 + R_1 + R_2) V_0 + R_2 Vin$$

$R_2 Vin = (R_1 + R_2 + sC_1 R_1 R_2 + sR_1 R_2 C_2 \frac{1}{b} + sR_2^2 C_2 \frac{1}{b} + s^2 R_1 R_2^2 C_1 C_2 \frac{1}{b} - R_1 - sC_1 R_1 R_2) V_0$ $(1 + sR_1 C_2 \frac{1}{b} + sR_2 C_2 \frac{1}{b} + s^2 R_1 R_2 C_1 C_2 \frac{1}{b}) V_0 = Vin$ The transfer function, $$\frac{V_0}{Vin},$$

is therefore given by $$\frac{V_0}{Vin} = \frac{\frac{b}{R_1 R_2 C_1 C_2}}{s^2 + \left(\frac{1}{R_1 C_1} + \frac{1}{R_2 C_1}\right)s + \frac{b}{R_1 R_2 C_1 C_2}} \qquad (3)$$

where b is a parameter which is defined by the switch positions in the R-2R ladder, s is the Laplace variable equal to jw, where $j=\sqrt{-1}$ and w is the frequency in radians, and $V_2$ is the voltage at the junction between resistors $R_1$ and $R_2$. The parameter b changes linearly from $\frac{1}{2^n}$ to 1 in $\frac{1}{2^n}$ segments. The switch positions may be readily controlled via digital control lines.

Figure 3:
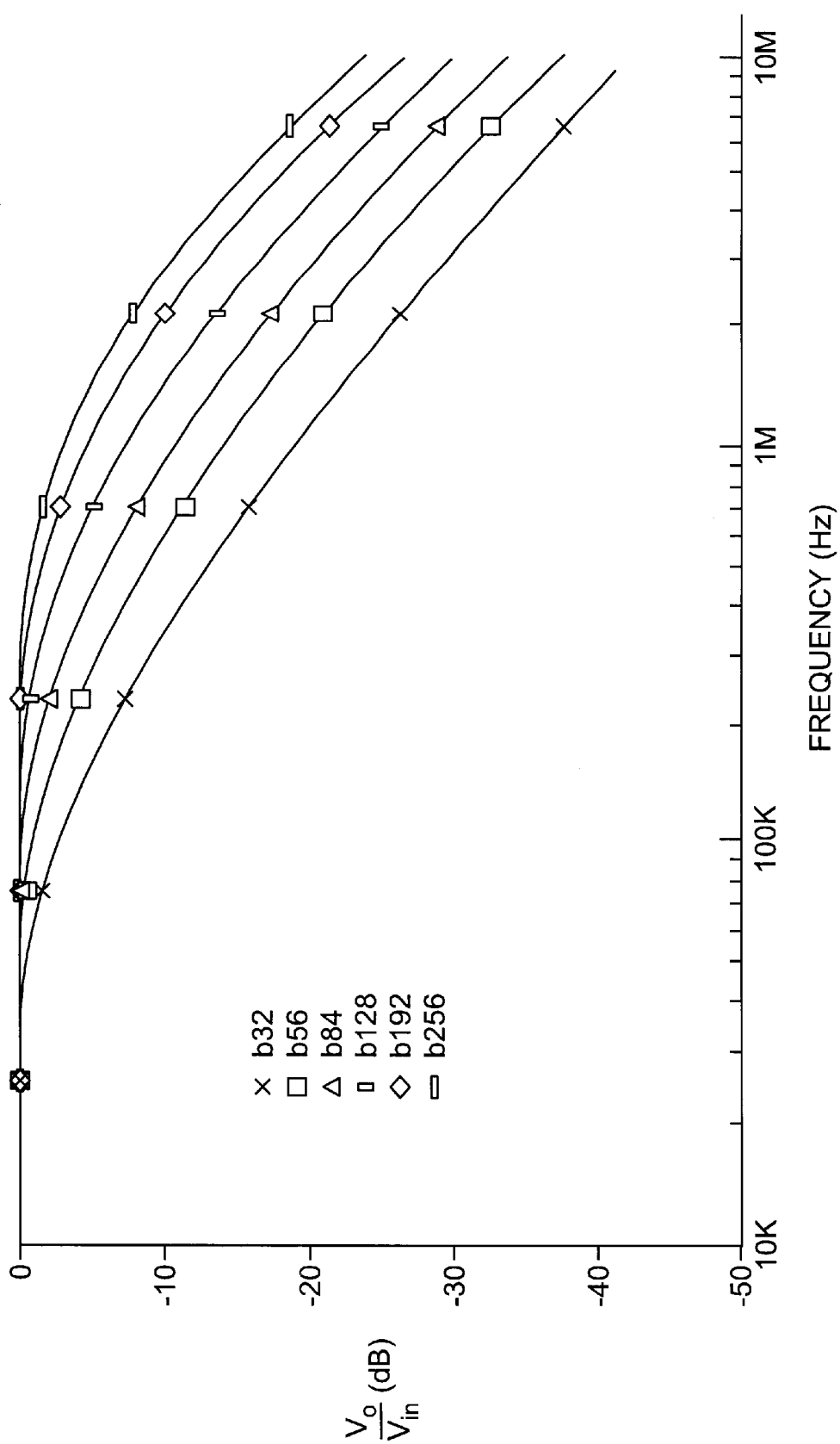
FIG. 3 illustrates the transfer function of the circuit of FIG. 1b as a function of a switch position parameter of the ladder circuit of FIG. 2.

The variation of the transfer function with b is illustrated in FIG. 3. Equation 3 illustrates that the b parameter controls the transfer function poles (i.e. the roots of the denominator of equation 3) without affecting the DC gain of the transfer function. The b parameter also controls the roll-off characteristics of the transfer function, as indicated in FIG. 4, with the various curves in this plot showing the transfer function of $\frac{1}{b}$. For example, the b32 curve refers to the transfer function when $b=\frac{1}{32}$, the b56 curve refers to the transfer function when $b=\frac{1}{56}$, and so on.

The use of a resistor ladder network in place of one of the resistors of a Sallen-Key filter section with the amplifier connected in a unity gain configuration provides a unique and highly efficient method for tuning the circuit. By varying the number of network switches which are open and closed, the circuit response or transfer function can be easily controlled. Although the resistor ladder network in the illustrated embodiment is an R-2R network, other variations are possible with the switchable branches having resistors which are different multiples of R.

Although an exemplary embodiment of the invention has been described above by way of example only, it will be understood by those skilled in the field that modifications may be made to the disclosed embodiment without departing from the scope of the invention, which is defined by the appended claims.

I claim:

1. A filter circuit assembly, comprising:

a filter circuit including an operational amplifier connected in unity gain, the amplifier having a positive input, a negative input, and an output; and at least one adjustable resistor connected in series with the amplifier input, the adjustable resistor comprising a resistor ladder network, the ladder network having an input and first and second output terminals, a plurality of arms connected in series between the input and first output terminal, each arm having a resistor R and a node separating each pair of adjacent arms, a shunt arm connected to each node, each shunt arm having a resistor which has a value which is a multiple of R and a switch in series, each switch having a first, closed position connecting the shunt arm to the first output terminal and a second, open position connecting the shunt arm to the second output terminal, such that the resistance of the ladder network is varied dependent on the switch positions and is at a maximum value when all switches are closed and a minimum value when all switches are open, whereby a resistance can be tuned by varying the switch positions in the ladder circuit, the first output terminal being connected to the amplifier output and the second output terminal being connected to the amplifier positive input.

2. The assembly as claimed in claim 1, wherein the ladder network is an R-2R ladder network.

3. The assembly as claimed in claim 1, including a circuit input and first and second resistors connected in series between the circuit input and amplifier, the second resistor comprising the adjustable ladder network.

4. The assembly as claimed in claim 3, including a junction between the first and second resistors and a capacitor connected between the junction and the amplifier output.

5. The assembly as claimed in claim 4, including a second capacitor connected between the amplifier positive input terminal and ground.

6. The assembly as claimed in claim 1, wherein the circuit comprises a Sallen-key filter circuit.

7. A method of tuning a Sallen-key filter circuit, comprising the steps of:

replacing the second resistor of a Sallen-key filter circuit with a resistor tuning network comprising a resistor ladder network;

connecting the output of operational amplifier of the Sallen-key filter circuit to the negative input of the amplifier;

connecting a first output terminal of the tuning network to the output of the operational amplifier;

connecting a second output terminal of the tuning network to an input terminal of the operational amplifier; and varying the resistance of the resistor ladder network by selectively opening and closing switches in branches of the ladder network to control which branches are connected to the first output terminal and which branches are connected to the second output terminal, whereby the filter response can be tuned.

8. A Sallen-Key filter circuit assembly, comprising:

a circuit having an input terminal and an output terminal;

first and second resistors and an operational amplifier connected in series between the input terminal and the output terminal, the operational amplifier having a negative input connected to the output terminal;

a first junction between the first and second resistors and a second junction between the second resistor and operational amplifier;

a first capacitor connected between the first junction and output terminal;

a second capacitor connected between the second junction and ground;

one of the resistors comprising an adjustable resistor;

the adjustable resistor comprising a resistor ladder network, the ladder network having an input and first and second output terminals, a plurality of arms connected in series between the input and first output terminal, each arm having a resistor R and a node separating each pair of adjacent arms, a shunt arm connected to each node, each shunt arm having a resistor which has a value which is a multiple of R and a switch in series, each switch having a first, closed position connecting the shunt arm to the first output terminal and a second, open position connecting the shunt arm to the second output terminal, such that the resistance of the ladder network is varied dependent on the switch positions and is at a maximum value when all switches are closed and a minimum value when all switches are open, whereby a resistance can be tuned by varying the switch positions in the ladder circuit, the first output terminal being connected to the amplifier output and the second output terminal being connected to an amplifier input.

9. The assembly as claimed in claim 8, wherein the resistor ladder network is an R-2R ladder network.

10. The assembly as claimed in claim 8, wherein the second resistor comprises the adjustable resistor ladder network.

* * * * *